United States Patent
Jordan et al.

(10) Patent No.: US 8,669,460 B2
(45) Date of Patent: Mar. 11, 2014

(54) SYSTEM AND METHODS FOR OPTIMAL LIGHT COLLECTION ARRAY

(75) Inventors: Mead M. Jordan, Tucson, AZ (US); David G. Jenkins, Tucson, AZ (US); Devon G. Crowe, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 766 days.

(21) Appl. No.: 12/116,902

(22) Filed: May 7, 2008

(65) Prior Publication Data

US 2008/0276982 A1   Nov. 13, 2008

Related U.S. Application Data

(63) Continuation-in-part of application No. 11/733,544, filed on Apr. 10, 2007.

(51) Int. Cl.
  *H02N 6/00* (2006.01)
  *H01L 31/042* (2006.01)

(52) U.S. Cl.
  USPC .......................................................... 136/246

(58) Field of Classification Search
  USPC .......................................................... 136/246
  See application file for complete search history.

(56) References Cited

U.S. PATENT DOCUMENTS

| | | | |
|---|---|---|---|
| 3,490,950 A | 1/1970 | Myer | |
| 3,536,372 A | 10/1970 | Beatty | |
| 4,235,643 A * | 11/1980 | Amick | 136/246 |
| 4,251,288 A * | 2/1981 | Yerkes | 136/247 |
| 4,311,869 A * | 1/1982 | Kurth et al. | 136/246 |
| 4,313,024 A | 1/1982 | Horne | |
| 4,348,546 A * | 9/1982 | Little | 136/256 |
| 4,509,501 A | 4/1985 | Hunter | |
| 5,076,857 A * | 12/1991 | Nowlan | 136/256 |
| 5,288,337 A * | 2/1994 | Mitchell | 136/246 |
| 5,409,550 A | 4/1995 | Safir | |
| 5,482,568 A | 1/1996 | Hockaday | |
| 5,796,892 A | 8/1998 | Karni et al. | |
| 6,689,949 B2 | 2/2004 | Ortabasi | |
| 2003/0201007 A1* | 10/2003 | Fraas et al. | 136/246 |
| 2003/0213514 A1 | 11/2003 | Ortabasi | |
| 2004/0079358 A1 | 4/2004 | Arkas et al. | |
| 2005/0046977 A1* | 3/2005 | Shifman | 359/853 |
| 2006/0054212 A1* | 3/2006 | Fraas et al. | 136/246 |
| 2006/0283497 A1 | 12/2006 | Hines | |

OTHER PUBLICATIONS

Patrick Jordan & Frank Krennrich, The Design of Light Concentrators for a 12m Cherenkov Telescope, Jul. 9, 2004.
Jenkins, "Concentrator Designs to Achieve Flux Uniformity for Concentrating Photovoltaic Systems," Optical Research Associates, Dec. 6, 2000, pp. 1-115.
Jenkins, "Design of High-Uniformity Photovoltaic Concentrating Systems," Optical Research Associates, SPIE, Aug. 2001, pp. 1-26.

(Continued)

*Primary Examiner* — Tamir Ayad
(74) *Attorney, Agent, or Firm* — Renner, Otto, Boisselle & Sklar, LLP

(57) ABSTRACT

Apparatus and methods according to various aspects of the present invention may operate in conjunction with a light collection array. One or more light redirectors located at or near inactive areas of light collection arrays may redirect incident light to active areas. In one embodiment, the light redirector may be implemented with additional light redirectors and/or a concentrating photovoltaic collection system.

10 Claims, 6 Drawing Sheets

TYPICAL
  $g_{PV}$ = 0.1, 0.2, 0.3 cm
  $w_{PV}$ = 1 cm
  $h_g$ = 0.001, 0.025, 0.050, 0.075, 0.100 cm
  $w_g$ = 1.0, 1.1, 1.2, 1.3, 1.4 $g_{PV}$
  $h_{triangle}$ ~ 1.4$w_g$
  $\rho_{gap}$ = 0% (Worst-Case, Gaps Absorb)
  $\rho_{PV}$ = 3% (Spectrolab Number)
  $\rho_g$ = 98.5% (Enhanced Silver)

(56) References Cited

OTHER PUBLICATIONS

Jenkins, "High-Uniformity Solar Concentrators for Photovoltaic Systems," Optical Research Associates, pp. 1-8.

International Search Report and Written Opinion for International Application No. PCT/US2008/058875, dated Jun. 18, 2009.

Davies et al., "Calculations of Efficiencies Achievable Using Gallium Arsenide and Silicon Cells Mounted Together in Cavities Illuminated by Single-Stage Concentration," Solar Energy Materials and Solar Cells, Elsevier Science Publishers, Amsterdam, NL, vol. 26, No. 3, Apr. 1, 1992, pp. 203-215.

Luque et al., "Optical Aspects in Photovoltaic Energy Conversion," Solar Cells, Elsevier Sequoia.S.A., Lausanne, CH, vol. 31, No. 3, Jun. 1, 1991, pp. 237-258.

Daniel Feuermann et al., "High-Concentration Photovoltaic Designs Based on Miniature Parabolic Dishes", Nonimaging Optics: Maximum Efficiency Light Transfer VI, Roland Winston, Editors, Proceedings of SPIE vol. 4446 (2002), pp. 43-51.

Joesph J. O'Gallagher et al., "Nonimaging Solar Concentrator with Near Uniform Irradiance for Photovoltaic Arrays", Nonimaging Optics: Maximum Efficiency Light Transfer VI, Roland Winston, Editors, Proceedings of SPIE vol. 4446 (2002), pp. 52-56.

David G. Jenkins, "High-Uniformity Solar Concentrators for Photovoltaic Systems", Nonimaging Optics: Maximum Efficiency Light Transfer VI, Roland Winston, Editors, Proceedings of SPIE vol. 4446 (2002), pp. 80-87.

Roe Goodman, "Alice through Looking Glass after Looking Glass: The Mathematics of Mirrors and Kaleidoscopes", The Mathematical Association of America, 111 (Apr. 2004), pp. 281-298.

Ugur Ortabasi et al., "Second-Generation PVCC Design with a Dielectric Light Injector and Polyhedron Interior Cavity", SPIE Optics & Photonics (Aug. 2006), Powerpoint Presentation, Slides 1-29.

\* cited by examiner

TYPICAL
- $g_{PV}$ = 0.1, 0.2, 0.3 cm
- $w_{PV}$ = 1 cm
- $h_g$ = 0.001, 0.025, 0.050, 0.075, 0.100 cm
- $w_g$ = 1.0, 1.1, 1.2, 1.3, 1.4 $g_{PV}$
- $\rho_{gap}$ = 0% (Worst-Case, Gaps Absorb)
- $\rho_{PV}$ = 3% (Spectrolab Number)
- $\rho_g$ = 98.5% (Enhanced Silver)

TYPICAL
- $g_{PV}$ = 0.1, 0.2, 0.3 cm
- $w_{PV}$ = 1 cm
- $h_g$ = 0.001, 0.025, 0.050, 0.075, 0.100 cm
- $w_g$ = 1.0, 1.1, 1.2, 1.3, 1.4 $g_{PV}$
- $h_{triangle}$ ~ 1.4$w_g$
- $\rho_{gap}$ = 0% (Worst-Case, Gaps Absorb)
- $\rho_{PV}$ = 3% (Spectrolab Number)
- $\rho_g$ = 98.5% (Enhanced Silver)

SYSTEM AND METHODS FOR OPTIMAL LIGHT COLLECTION ARRAY

CROSS REFERENCE TO RELATED APPLICATIONS

The present application is a continuation-in-part of U.S. Nonprovisional patent application Ser. No. 11/733,544, filed Apr. 10, 2007, entitled Concentrating Photovoltaic Kaleidoscope and Method, and incorporates the disclosure of such application by reference.

BACKGROUND OF INVENTION

Photovoltaic cells convert solar energy into electrical energy to power various applications, from handheld calculators and street signs to water pumping applications and large grid-tied electrical systems. Photovoltaic cells are particularly useful, however, in remote and extra-orbital applications where grid electricity is not available. Individual photovoltaic cells are generally implemented for smaller applications, such as handheld calculators. Larger applications, such as grid-tied solar panels and photovoltaic panels powering satellites, require multiple cells to generate electrical energy needed.

The implementation of multiple photovoltaic cells presents several challenges. Conventional photovoltaic cells have an active area surrounded by an inactive area. Because the inactive area generally includes the edge of a cell, the active areas of the cells cannot be placed adjacent to each other, causing a grid-like area where light is either absorbed or reflected and cannot be converted to electrical energy. Additionally, to create a photovoltaic array, many photovoltaic cells are connected in series and these series strings are connected in parallel to achieve the desired output voltage and power for the photovoltaic array. The current produced, however, tends to be limited by the cell illuminated by the least amount of light in a series string of photovoltaic cells.

Further, to harness the electrical energy generated by absorption of light, metal is deposited across various portions of the photovoltaic cells. Many photovoltaic designs have the widest metalized regions at the edge of the photovoltaic cell and minimize metalized regions farther in from the edges. Light incident on the metalized regions is reflected away from the active regions of the photovoltaic array and lost from the conversion process for typical photovoltaic cell systems.

SUMMARY OF THE INVENTION

Apparatus and methods according to various aspects of the present invention may operate in conjunction with a light collection array. One or more light redirectors located at or near inactive areas of the light collection array may redirect incident light to active areas. In one embodiment, the light redirector may be implemented with additional light redirectors and/or a concentrating photovoltaic collection system.

BRIEF DESCRIPTION OF THE DRAWINGS

A more complete understanding of the present invention may be derived by referring to the detailed description and claims when considered in connection with the following illustrative figures. In the following figures, like reference numbers refer to similar elements and steps throughout the figures.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The present invention may be described in terms of functional block components and various processing steps. Such functional blocks may be realized by any number of elements configured to perform the specified functions and achieve the various results. For example, the present invention may employ various photovoltaic arrays, light redirectors, reflective materials and the like, which may carry out a variety of functions. In addition, the present invention may be practiced in conjunction with any number of light collection applications, and the system described is merely one exemplary application for the invention. Further, the present invention may employ any number of conventional techniques for manufacturing reflective materials, photovoltaic arrays, light redirectors, and the like.

Methods and apparatus according to various aspects of the present invention may be implemented in conjunction a light redirector and a target area. The light redirector redirects light to the target area, for example to concentrate light for energy generation. The methods and apparatus may operate in conjunction with any redirectable energy, such as solar energy and/or other electromagnetic energy applications. The target area may include systems for converting the redirectable energy into another form of energy, such as via light collection arrays, photoconductive arrays, thermal arrays, photovoltaic panels, solar panels, solar arrays, and the like for converting the redirectable energy into electricity or heat.

Figure 1:
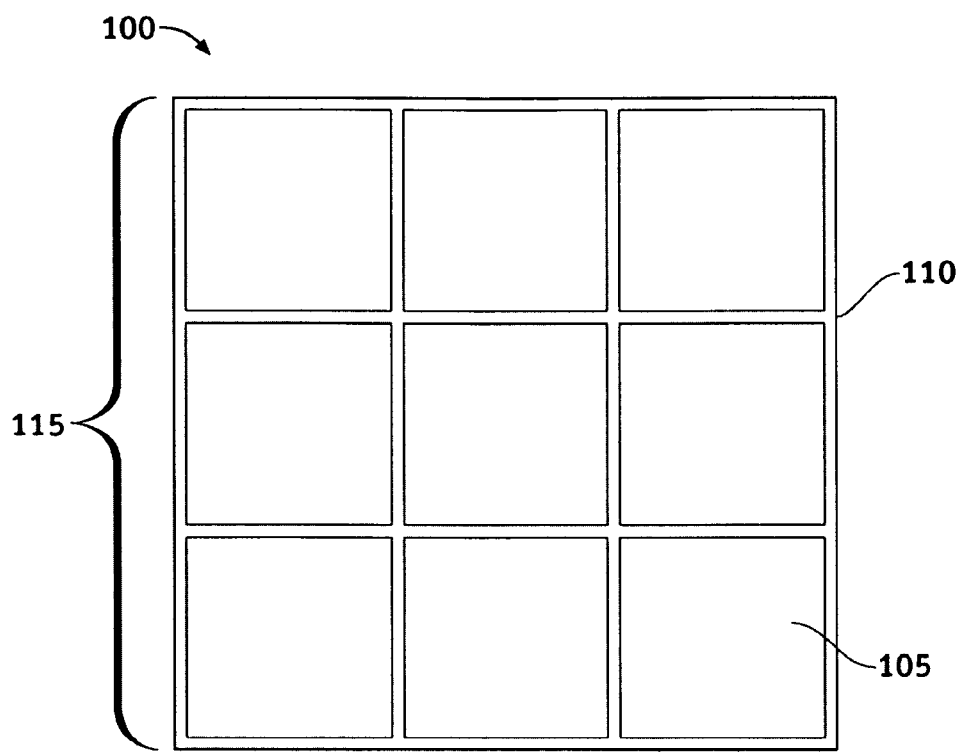
FIG. 1 depicts a photovoltaic array.

In one embodiment, a light collection system in accordance with various aspects of the present invention includes a light director and a light collection array, such as a photovoltaic array. The photovoltaic array may comprise one or more photovoltaic cells. For example, referring to FIG. 1, a photovoltaic array 100 may comprise multiple cells 115 comprising active areas 105 and inactive areas 110. The active areas 105 of a photovoltaic cell 115 convert light into electrical energy. Inactive areas 110 do not convert light into electrical energy. The photovoltaic array 100 may comprise any suitable system for converting electromagnetic radiation to electricity.

The photovoltaic cells 115 in the array 100 may be wired in series to create a series string which can be wired in parallel with other series strings to provide electricity to a load. Redirecting incident light from inactive areas 110 to active areas 105 tends to increase the magnitude, efficiency, and/or uniformity of the current produced by the panel or array. In various embodiments of the present invention, the effects of inactive areas 110 may be minimized through one or more light redirectors.

The light redirector redirects light to the target area, such as away from the inactive areas 110 and towards the active areas 105, for example to provide a more concentrated and/or more uniform distribution of light on the active areas 105. The light redirector may comprise any suitable element or system for redirecting, reflecting, focusing and/or concentrating incident light. The light redirector may redirect light using any appropriate redirection phenomena or technique, including reflection, refraction, or diffraction. The light reflector may comprise any suitable dimensions, including size, shape, and texture, for redirecting incident light to one or more active areas 110 of the photovoltaic array 100, such as according to the configuration of the photovoltaic array 100. The light redirector may a single integrated component or multiple parts. Further, the size and placement of the light redirector may be selected, for example to compensate for shadows produced by objects in the light path, to conform to a particular inactive area, to reduce shadows, or otherwise to conform to relevant criteria for a particular application and/or environment.

The light redirector may be configured in any appropriate manner to redirect light away from the inactive area 110 and into the active area 105. For example, the light redirector may comprise multiple surfaces, wherein at least one surface is configured to redirect incident light, and at least one surface is configured to cover the inactive area 110 of the photovoltaic array 100. The redirecting surfaces may include reflective materials, reflective surfaces formed on materials, reflective coatings attached to a substrate, material substantially covered by a highly reflective coating, layer, material and the like, including metals, metal coatings, mirrors and/or the like. The redirecting surfaces may exhibit high reflectivity relative to the inactive and/or active areas 110, 105 of the photovoltaic cell 115. For example, reflectivity of the inactive area ($\rho_{gap}$) 530 may be low, such as approaching 0% (fully absorbing light). The reflectivity of the active area 535 ($\rho_{pv}$) of a photovoltaic cell 545, 550, may be approximately 3%. The reflectivity of the light redirector ($\rho_g$) may be approximately 98.5%, for example where the surface of the light redirector comprises enhanced silver.

Alternatively, the light director may comprise refractive materials. The light director may also include any other appropriate elements or systems for a particular application or environment. For example, the light redirector may comprise at least one surface coated with a dielectric protective overcoat to withstand higher temperatures from concentrated solar energy.

The light director may be configured to cover inactive areas and/or replace active areas of the photovoltaic array 100 that may be less efficient, exposed to less light than other cells in a series string, or the like. For example, the light redirector may redirect light from an area associated with a shadow on the photovoltaic array 100 to the active area 105. By removing the area in the shadow from the active areas 105, the light distribution on the active areas 105 is more uniform, thus reducing the current limiting effect of one or more cells illuminated by less light than other cells. In addition, light incident upon the light redirector is redirected to active areas to promote greater light conversion.

Figure 2:
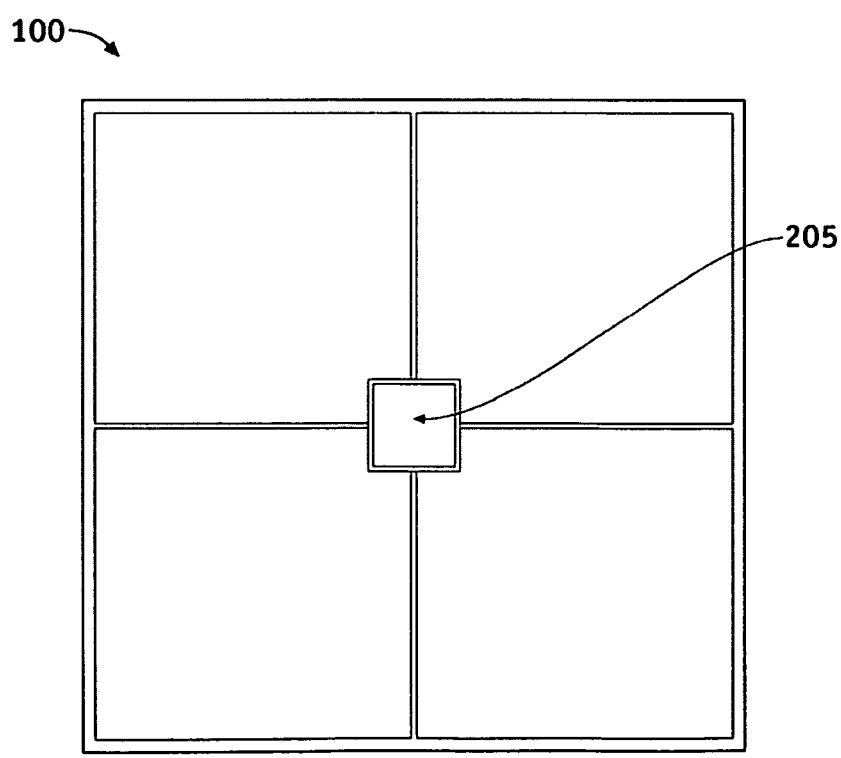
FIG. 2 depicts a center reflector in a photovoltaic array.
Figure 3A:
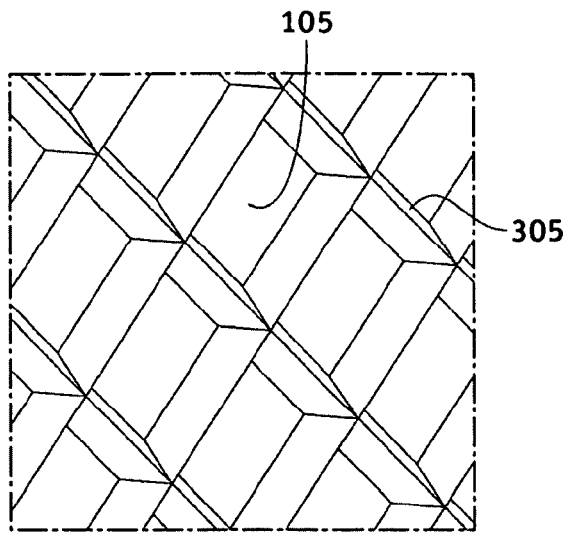
FIGS. 3A-C depict elements of a system of light redirectors and a photovoltaic array.
Figure 3B:
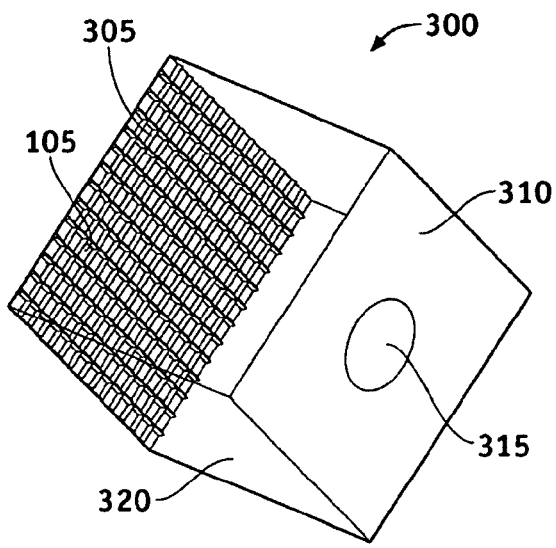
Figure 3C:
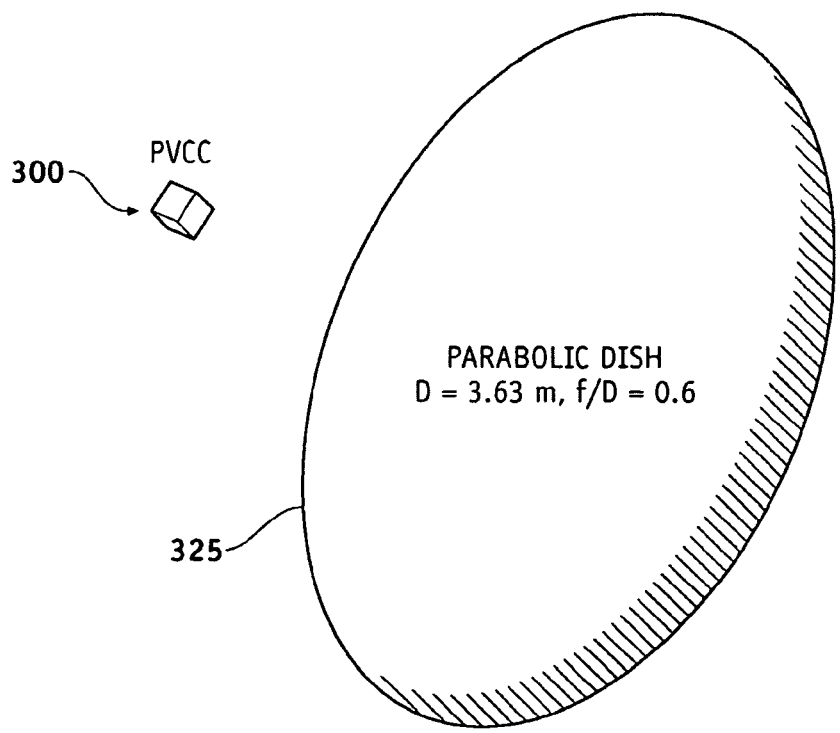

For example, referring to FIGS. 2 and 3C, the light redirector 205 may occupy an area coincident with a shadow on the photovoltaic array 100, for example due to a photovoltaic collection system 300 situated at a focal point of a parabolic dish 325. The light redirector 205 may redirect light onto adjacent active areas 105 of the photovoltaic array 100. In the present embodiment, the light redirector 205 may comprise a pyramidal and/or conic shape, and may be placed in the center of a photovoltaic array 100.

The exposed sides of the light redirector 205 may redirect light to the photovoltaic array 100, for example by reflecting light towards the active areas 105. In one embodiment, the light redirector 205 includes a reflective exposed side. The exposed side is inclined so that incident light, such as light approaching normal to the photovoltaic array 100, is reflected away from the center of the photovoltaic array 100 and onto the active areas 105. Alternatively, the exposed side may redirect light to the photovoltaic array 100 indirectly, for example via additional reflectors or light directors. The height of the light redirector 205 may be selected according to any appropriate criteria, such as to provide adequate incline to redirect the light away from the source and towards the active areas 105.

The light redirector 205 further comprises a covering surface on the bottom of the light director and attached to the top surface of the photovoltaic array 100. The area under the light redirector 205 may be inactive so that the lack of light upon the area does not limit the current from photovoltaic array 100. The bottom surface may comprise any suitable material, such as a material that mates with or adheres to the top surface of the photovoltaic array 100, and may cover all or a portion of the inactive area 110 associated with the shadow. Placing the light redirector 205 over the inactive area 110 may shield the inactive area 110 from heat due to incident light.

Figure 4:
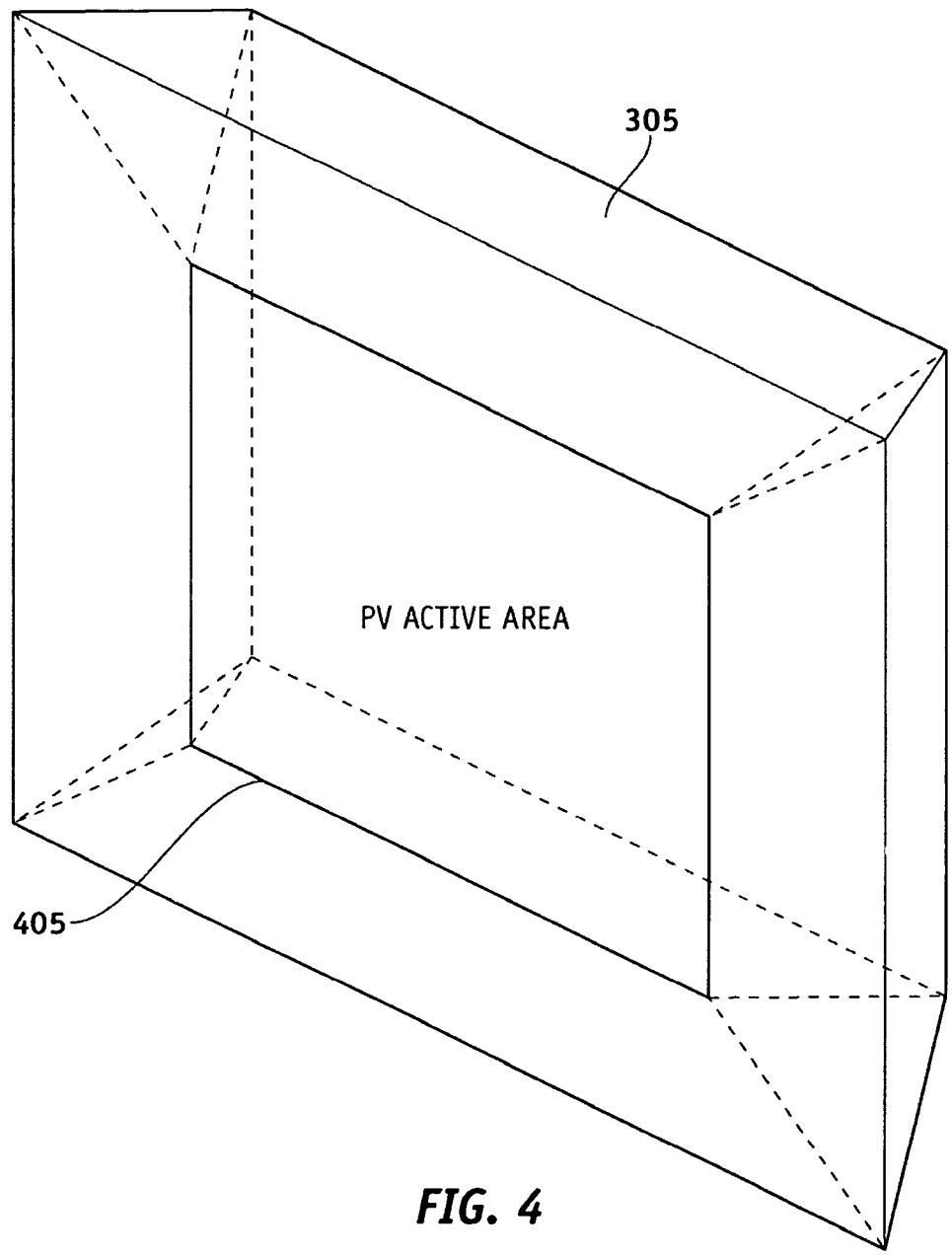
FIG. 4 illustrates a frame light redirector placed on a photovoltaic array.

Referring to FIG. 4, an alternative light redirector 305 may be disposed on an inactive border of the photovoltaic array 100 and surround the active area 405. In this embodiment, the light redirector 305 comprises a frame for the active area 405. The light redirector 305 is placed around the edge of the active area 405 of the photovoltaic array 100. The light redirector 305 may have one or more angled reflective sides to redirect incident light at the edge of the active area 405 onto the active area 105. The height, angle, and width of the angled sides may be selected according to any appropriate criteria, such as the relative size of the active area 405, the potential for creating shadows due to light approaching from an angle, the size of the inactive border area, and the like. For example, the width may be selected to cover as much of the inactive area as possible. The height may be selected to create a reflective angle such that all normal incident light, or light approaching from other selected angles, is reflected onto the active area 405 or to another reflective surface or photovoltaic array.

In another embodiment, the light reflector 305 comprises an inter-cell reflective mesh and/or grid. Referring to FIG. 3A, the light redirector may comprise a grid 305 placed over the inactive areas 110 between the active areas 105 of the photovoltaic array 100 such that the inactive areas 110 are inhibited from absorbing light. The grid 305 may be attached to or formed into the photovoltaic array 100 at the time of manufacture or retrofitted onto existing panels.

The grid 305 may be configured to redirect incident light away from the inactive areas 110 to the active areas 105. The grid 305 may redirect incident light directly or indirectly onto the active areas 105. For example, the grid 305 may comprise a flat, triangular, and/or other suitable shapes. Further, the grid shape and spacing may be optimized to minimize shadows on the active areas 105.

Figure 6:
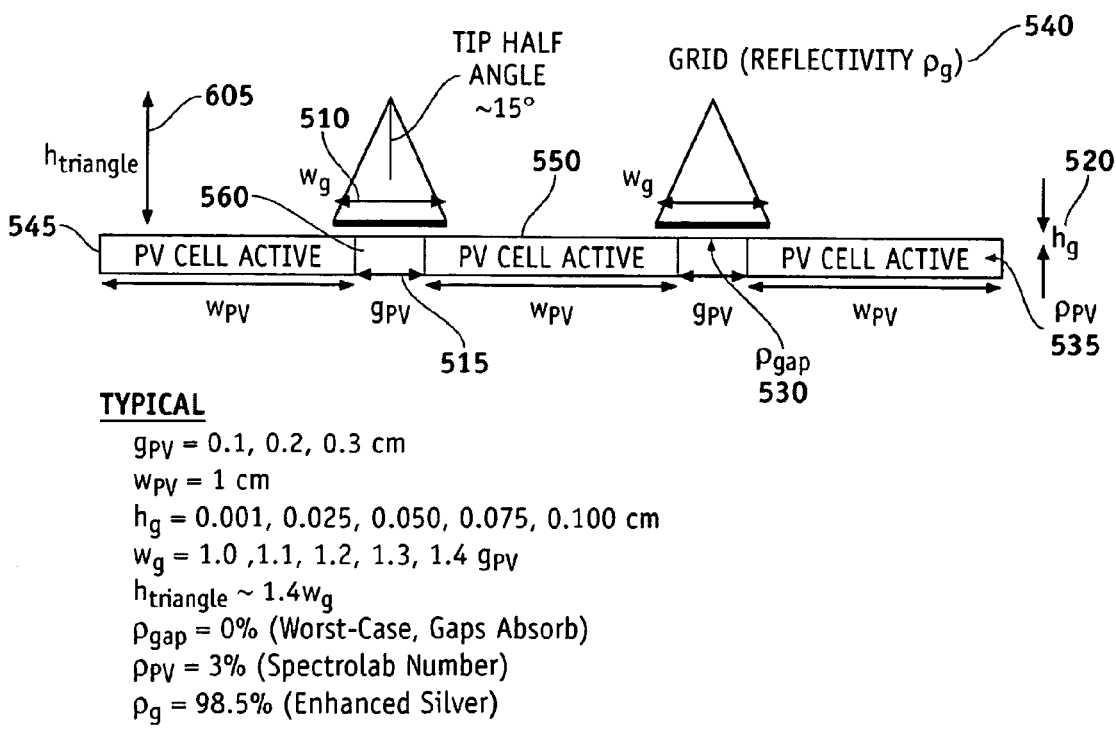
FIG. 6 illustrates a peaked grid light redirector on a photovoltaic array.

For example, referring to FIG. 6, the grid 305 may comprise a triangular cross-section, such as to directly transfer incident light onto the active areas 105. The upper sides may be reflective and form any suitable angle for redirecting incident light onto an adjacent active area 105. In embodiments where the photovoltaic array 100 directly faces a light source, the triangular grid may minimize the amount of light reflected back to the light source. In embodiments where light approaches at non-normal angles, all or parts of the triangular grid may be adapted to minimize shadows caused by the triangular grid on the active areas 105 of the photovoltaic array 100, such as by reducing the height of the grid 305 above the active areas 105.

The height of the triangular grid may be selected according to any appropriate criteria, such as to maximize redirection of light incident on the grid 305 to the active areas 105 of the photovoltaic array 100. For example, an exemplary photovoltaic array 100 may comprise inactive areas 560 approximately 0.1 cm to 0.3 cm wide ($g_{pv}$) between adjacent active areas 545, 550, which are approximately 1 cm wide ($w_{pv}$). The triangular cross-section grid 305 may have a height ($h_{triangle}$) 605 approximately 1.4 times the width of the base of the triangular cross section ($w_g$) 510. The width of the grid 305 may correspond to the width of the inactive area ($g_{pv}$) 515 between adjacent active areas of photovoltaic cells 545, 550.

In another embodiment of the present invention, the grid 305 may comprise a relatively flat grid reflector. The flat grid reflector may comprise any suitable size, dimension, texture and/or material to cover inactive areas of the photovoltaic array and to reflect and/or redirect incident light. In one embodiment, the flat grid reflector redirects light onto the active areas indirectly, such as via other reflective surfaces.

Figure 5:
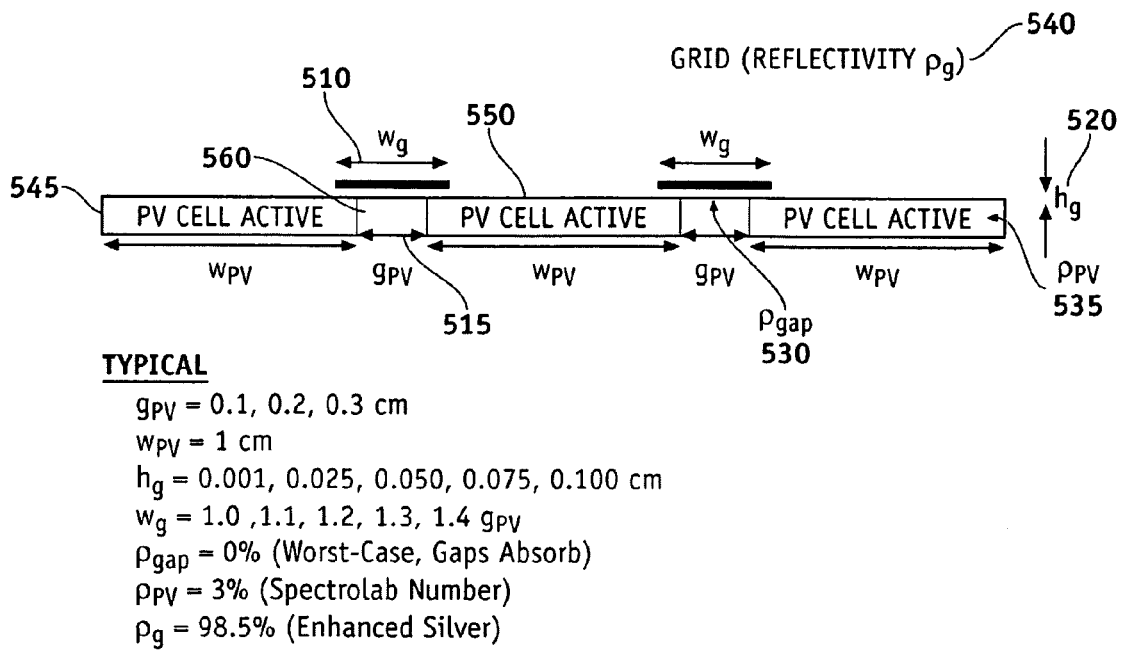
FIG. 5 illustrates a flat grid light redirector on a photovoltaic array.

The dimensions of the grid may be selected according to any appropriate criteria, such as to cover the inactive areas 110 and minimize shadows on the active areas 105. In one embodiment, the width of the individual line of the grid ($w_g$) 510 may comprise the width of the combined inactive area of two adjacent photovoltaic cells ($w_{pv}$) plus the height of the grid above the inactive area ($h_g$), which may promote efficiency of the flat grid reflector in combination with additional reflectors, such as a photovoltaic collection system. Referring now to FIG. 5, the width of an exemplar grid ($w_g$) 510 cross-section may be approximately 1.0 to 1.4 times the width of the inactive area ($g_{pv}$) 515. In one embodiment, the width $g_{pv}$ of the inactive area 560 may be approximately 0.1 cm to 0.3 cm, and the active areas 545, 550 may be approximately 1 cm wide ($w_{pv}$).

The light redirector may be implemented in conjunction with one or more additional reflective surfaces or other systems for reflecting light from the light redirector to the active areas 105. For example, the additional light redirectors may be adapted to redirect light rays reflected from the grid light redirector and/or center light redirector to the active areas 105. In one embodiment, a flat grid light redirector may be implemented to cover inactive areas of a photovoltaic array, and one or more additional reflective surfaces may form a substantially uniform reflective field and may be placed to redirect light reflected from flat grid redirector. For example, in embodiments where a light source directs light substantially normal to the flat grid or center light redirector, the additional reflective surface may be placed directly above the photovoltaic array 100. Thus, light incident upon the inactive areas is reflected by the light redirector back up onto the additional reflective surface, which reflects the light back down onto the active areas 105.

One or more light redirectors according to various aspects of the present invention may be implemented in conjunction with a concentrating photovoltaic collection system. The collection system may be configured to concentrate light upon the photovoltaic array 100.

The photovoltaic array 100 may be at least partially enclosed by one or more light redirectors. In one embodiment, multiple light redirectors may be oriented around a photovoltaic array 100 in a concentrating photovoltaic collection system. For example, referring now to FIG. 3B, light redirectors may be placed perpendicular to the edges of the photovoltaic array to form the sides 320 of a photovoltaic collection system 300, where the photovoltaic array 100 comprises the bottom side. Further, a light redirector 310 may be oriented as a top to the box configuration, where the light redirector 310 is placed parallel to the photovoltaic array and perpendicular to the light redirectors that form sides 320 of a kaleidoscope box configuration. In other embodiments, the kaleidoscope structure may comprise any suitable shape or size comprising any number of sides, including triangular, pentagonal, hexagonal, or rhombicuboctahedron structures.

In the present embodiment, the top light redirector 310 may further define a void, such as a hole 315, through which light may reach the photovoltaic array 100. Light beaming through the hole 315 may come directly from a light source, such as the sun, or it may be incident light from yet another redirector, such as a parabolic dish. Referring now to FIG. 3C, the photovoltaic collection system 300 may be oriented such that the top light redirector 310 faces a parabolic dish 325. The parabolic dish 325 may comprise any suitable structure for concentrating, focusing and reflecting light. Suitable structural materials include ceramics, plastics, metals and the like. These materials may be covered by a reflective coating, such as metallic coating, to enhance their reflectivity. Additionally, the parabolic dish 325 may be any suitable dimension, size, shape and/or texture to concentrating, focusing and reflecting light. In one embodiment, the parabolic dish 325 may comprise a diameter of approximately 3.63 meters, and an f/D (focal distance/diameter) ratio of approximately 0.6.

In this embodiment, light is concentrated, focused and reflected off of the parabolic dish 325 to the photovoltaic collection system 300, which amplifies the amount of light entering through the hole 310 and into the photovoltaic collection system 300. Additionally, use of the photovoltaic collection system 300 may assist in the reuse or recycling of incident light that was not initially incident upon and absorbed by the active areas 105 of the photovoltaic array 100.

The photovoltaic collection system 300 may comprise any other additional structures for a particular implementation, application, or environment. In one embodiment, the hole 310 of the kaleidoscope system may be at least partially covered by a specular filter configured to filter certain wavelengths, such as those wavelengths not easily absorbed by the photovoltaic array 100. Additionally, photovoltaic collection system 300 may be implemented in conjunction with a cooling system, for example to cool the sides of a photovoltaic collection system 300, including loop coolant systems to counteract thermal energy that may produced in the system.

The photovoltaic array 100 forming the bottom of the box may include one or more light redirectors to redirect light incident upon the inactive areas 110 to the active areas 105. For example, the photovoltaic array 100 may include a grid reflector, a frame reflector, and a center reflector. The center reflector is placed in the center of the photovoltaic array 100 over the area corresponding to the shadow formed by the photovoltaic collection system 300 on the dish 325. Additional reflectors may extend from the center reflector to the edges of the photovoltaic array 100 to cover areas subject to shadows formed by one or more struts holding the photovoltaic collection system 300 in position relative to the dish 325. The center reflector and corresponding strut reflectors may comprise peaked structures to reflect light directly onto the active areas 105 and/or relatively flat structures to reflect light to the active areas 105 indirectly via the sides of the photovoltaic collection system 300.

The frame reflector may be placed around the outer edge of the photovoltaic array 100 to cover inactive areas around the border and redirect incident light, directly or indirectly via the photovoltaic collection system 300, to the active areas 105. Likewise, the grid reflector may be placed over the corresponding grid of inactive areas 110 between the active areas 105. The grid reflector may comprise peaked structures to reflect light directly onto the active areas 105 and/or relatively flat structures to reflect light to the active areas 105 indirectly via the sides of the photovoltaic collection system 300.

In operation, the dish 325 collects light and focuses the light on the photovoltaic array 100 through the hole 315. Most of the light incident upon the active areas 105 is absorbed and converted to electrical energy. Light that is reflected from the active areas 105 is largely transmitted to the other sides of the photovoltaic collection system 300 which directly and indirectly reflect the light back to the active areas 105 for conversion to electricity. Light incident upon the inactive areas 110 is reflected by the light redirectors, including the center redirector and associated strut redirectors, the frame redirector, and the grid redirector. Although some light may escape through the hole 315 and some may be absorbed and converted to heat, the light redirectors and the photovoltaic collection system 300 inhibit light loss and absorption, thus maximizing the light incident upon the active areas 105 and converted to electricity. In addition, the inactive areas 110 are not exposed to incident light, reducing the light absorbed by the inactive areas and associated heat generation.

Figure 7:
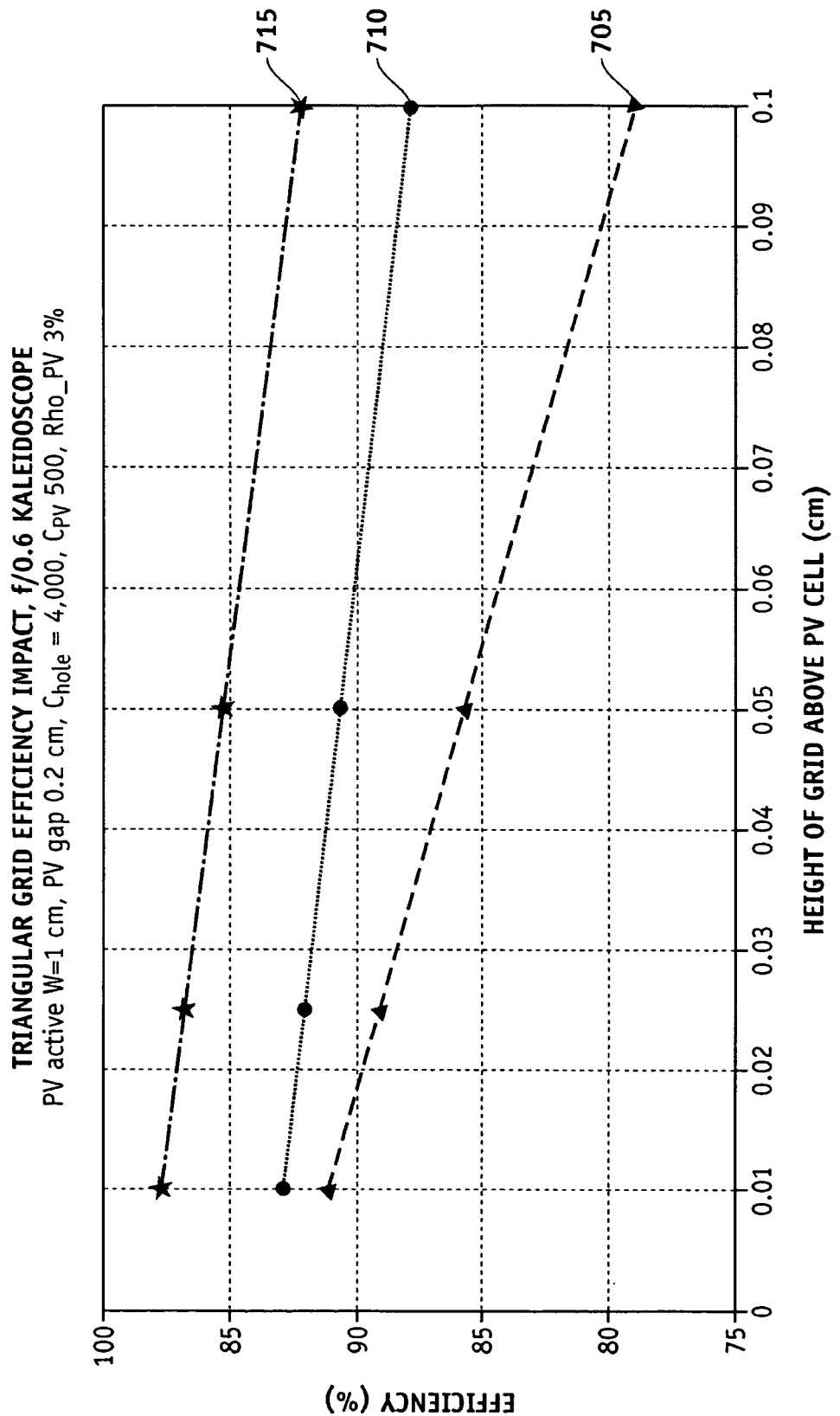
FIG. 7 is a graph illustrating efficiency of a triangular light redirector on a photovoltaic array.

Use of a kaleidoscope system 300 in conjunction with light reflectors tends to increase the efficiency and uniformity of irradiance at photovoltaic cells in a photovoltaic array. Referring now to FIG. 7, a chart comparing use of a grid reflector covering the inactive areas of the photovoltaic array with and without use of a photovoltaic collection system 300 demonstrates increased efficiency in the use of the grid light reflector 305 in combination with the photovoltaic collection system 300. Specifically, a system using a triangular grid reflector 305 without use of the photovoltaic collection system 300 has an efficiency range of approximately 78-91% (705). The triangular grid with the use of the photovoltaic collection system 300 has an efficiency range of approximately 92-98% (715). A system using a flat grid reflector with a photovoltaic collection system 300 has an efficiency range of approximately 87-92% (710).

Further, the height of the triangular grid above the photovoltaic cells ($h_g$) may decrease the efficiency of the photovoltaic array due to shadows the triangular grid may cast on active areas in light shown at angles other than 90°. Referring to FIG. 7, differing heights 705, 710, 715 may affect the efficiency of the system. In this case, the highest efficiency is exhibited at $h_g$=0.01 cm, the smallest measured height.

Figure 8:
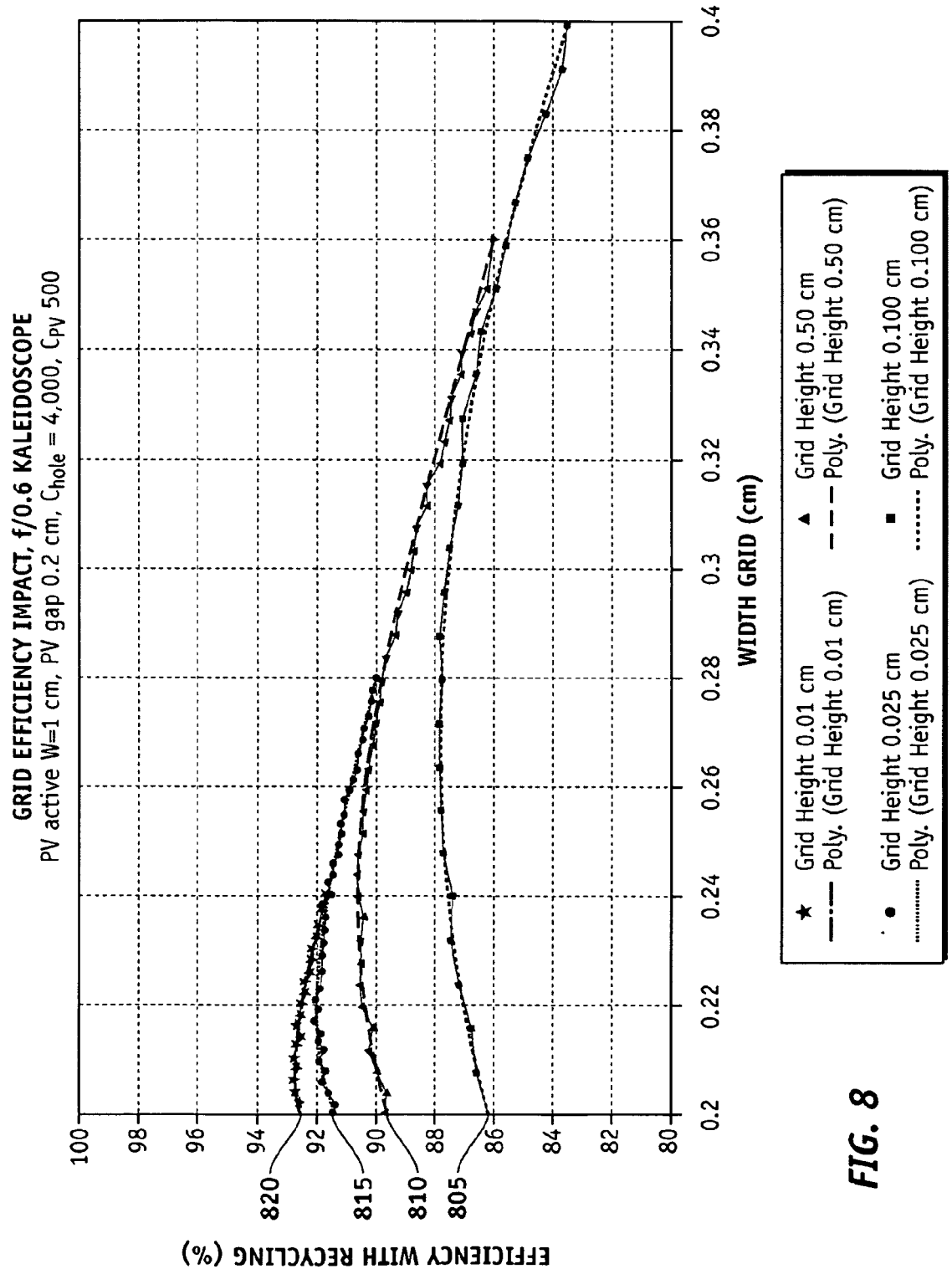
FIG. 8 is a graph illustrating efficiency impact for different light redirector configurations on a photovoltaic array.

Further, in embodiments where the kaleidoscope system 300 is used in conjunction with a flat grid light redirector at the inactive areas of a photovoltaic array, reducing the height of the grid light redirector above the photovoltaic cell ($h_g$) and/or width of the grid light redirector ($w_g$) may reduce shadows produced by the grid light redirector and increase the efficiency of the kaleidoscope system. For example, referring now to FIG. 8, various widths and various heights of a grid reflector above the photovoltaic array in the photovoltaic collection system 300 may affect the system's efficiency. Where $h_g$=0.01 cm (820), the efficiency may range from approximately 89%-92.5%, where the highest efficiency is seen at $w_g$=0.2-0.22 cm. Where $h_g$=0.025 cm (815), the efficiency may range from approximately 90%-92%, where the highest efficiency is seen at $w_g$=0.20 cm. Where $h_g$ is 0.050 cm (810), the efficiency may range from approximately 86%-90.5%, where the highest efficiency is seen at $w_g$=0.20 cm. Where $h_g$ is 0.100 cm (805), the efficiency may range from approximately 83.8%-87.9%, where the highest efficiency is seen at $w_g$=0.26-0.28 cm.

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

The terms "comprise", "comprises", "comprising", "having", "including", "includes" or any variation of such terms, refer to a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The invention claimed is:

1. An apparatus comprising a light redirector and a light collection array, wherein the light redirector redirects incident light onto the light collection array, the light collection array including:
   a top surface having multiple photovoltaic cells electrically connected in series, each cell having both photovoltaically active areas and photovoltaically inactive areas;
   wherein the light redirector is mounted over inactive areas of at least two cells in the light collection array to shade the inactive areas of the at least two cells;
   wherein the light redirector has an outer reflective surface to redirect incident light onto the active area of at least one cell,
   wherein the light redirector has a cross-section consisting of a triangle with a base corresponding to a bottom surface of the light redirector, wherein the bottom surface includes a material mounted to the top surface of the light collection array such that the bottom surface covers the inactive areas of the at least two cells and portions of active areas of the at least two cells of the light collection array.

2. The apparatus of claim 1, wherein the outer reflective surface of the light redirector has a reflectivity of approximately 98.5%.

3. The apparatus of claim 1, wherein the light redirector comprises a grid.

4. The apparatus of claim 1, wherein the apparatus includes a parabolic dish positioned to concentrate incident light on the light collection array.

5. The apparatus of claim 1, wherein the apparatus includes an enclosure having a reflective interior surface, wherein the enclosure encloses the light collection array.

6. A method for redirecting incident light to a light collection array including a top surface having multiple photovoltaic cells electrically connected in series, each cell having both photovoltaically active areas and photovoltaically inactive areas, the method comprising: disposing a light redirector on the light collection array to shade inactive areas of at least two cells, the light redirector having a bottom surface mounted over the inactive areas of the at least two cells in the light collection array;

the light redirector having an outer reflective surface to redirect incident light onto an active area of at least one cell, the light redirector having a cross-section consisting of a triangle with a base corresponding to the bottom surface of the light redirector, wherein the bottom surface includes a material mounted to the top surface of the light collection array such that the bottom surface covers the inactive areas of the at least two cells and portions of active areas of the at least two cells of the light collection array.

7. The method of claim 6, wherein redirecting the incident light comprises reflecting approximately 98.5% of the incident light.

8. The method of claim 6, wherein the light redirector comprises a grid.

9. A light energy converter system comprising: a parabolic dish;

a photovoltaic concentrator system disposed substantially at a focus of the parabolic dish, including: a photovoltaic field including a light collection array having a top surface having multiple photovoltaic cells electrically connected in series, each cell having both photovoltaically active areas and photovoltaically inactive areas;

the photovoltaic concentrator system including a light redirector mounted over inactive areas of at least two cells in the light collection array to shade the inactive areas of the at least two cells;

wherein the light redirector has an outer reflective surface to redirect incident light onto an active area of at least one cell;

wherein the light redirector has a cross-section consisting of a triangle with a base corresponding to a bottom surface of the light redirector;

wherein the bottom surface includes a material mounted to the top surface of the light collection array such that the bottom surface covers the inactive areas of the at least two cells and portions of active areas of the at least two cells of the light collection array;

the light energy converter system including an enclosure enclosing the photovoltaic field, the enclosure including a reflective interior surface and a surface facing the dish having a hole defined therethrough.

10. A light energy converter system according to claim 9, wherein the light redirector comprises a grid.

\* \* \* \* \*